US008835900B2

(12) United States Patent
Cheng et al.

(10) Patent No.: US 8,835,900 B2
(45) Date of Patent: Sep. 16, 2014

(54) HIGHLY SCALED ETSOI FLOATING BODY MEMORY AND MEMORY CIRCUIT

(75) Inventors: Kangguo Cheng, Schenectady, NY (US); Ali Khakifirooz, Mountain View, CA (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 13/154,677

(22) Filed: Jun. 7, 2011

(65) Prior Publication Data

US 2012/0313143 A1    Dec. 13, 2012

(51) Int. Cl.
*H01L 29/06* (2006.01)
*H01L 27/12* (2006.01)
*H01L 21/336* (2006.01)

(52) U.S. Cl.
USPC ....... 257/12; 257/347; 257/E21.645; 438/300

(58) Field of Classification Search
None
See application file for complete search history.

(56) References Cited

U.S. PATENT DOCUMENTS

| | | | | |
|---|---|---|---|---|
| 7,132,751 | B2 | 11/2006 | Chang | 257/758 |
| 7,244,991 | B2 | 7/2007 | Ohsawa | 257/347 |
| 7,517,741 | B2 * | 4/2009 | Orlowski et al. | 438/151 |
| 7,577,025 | B2 | 8/2009 | Kim et al. | 365/184 |
| 7,592,209 | B2 | 9/2009 | Chang | 438/149 |
| 7,772,649 | B2 | 8/2010 | Cheng et al. | 257/354 |
| 2003/0006461 | A1 * | 1/2003 | Tezuka et al. | 257/347 |
| 2004/0070051 | A1 * | 4/2004 | Sugiyama et al. | 257/616 |
| 2008/0173896 | A1 * | 7/2008 | Lin et al. | 257/192 |
| 2009/0010056 | A1 * | 1/2009 | Kuo et al. | 365/184 |
| 2009/0108351 | A1 | 4/2009 | Yang et al. | 365/189.011 |
| 2010/0246285 | A1 | 9/2010 | Tang et al. | 365/189.011 |

OTHER PUBLICATIONS

P. Poliakov et al., "Circuit Design for Bias Compatibility in Novel FinFET-Based Floating-Body RAM," IEEE Transactions on Circuits and Systems II: Express Briefs, vol. 57, No. 3, 2010, pp. 183-187.
Z. Lu et al., "A Simplified Superior Floating-Body/Gate DRAM Cell," IEEE Electron Device Letters, vol. 30, No. 3, Mar. 2009, pp. 282-284.
T. Hamamoto et al., "A floating-body cell fully compatible with 90-nm CMOS technology node for a 128-Mb DRAM and its scalability", IEEE Trans. Electron Devices, vol. 54, 2007, pp. 563-571.

* cited by examiner

*Primary Examiner* — Daniel Luke
(74) *Attorney, Agent, or Firm* — Ido Tuchman; Vazken Alexanian

(57) ABSTRACT

A floating body memory cell, memory circuit, and method for fabricating floating body memory cells. The floating body memory cell includes a bi-layer heterojunction having a first semiconductor coupled to a second semiconductor. The first semiconductor and the second semiconductor have different energy band gaps. The floating body memory cell includes a buried insulator layer. The floating body memory cell includes a back transistor gate separated from the second semiconductor of the bi-layer heterojunction by at least the buried insulated layer. The floating body memory cell also includes a front transistor gate coupled to the first semiconductor of the bi-layer heterojunction.

20 Claims, 3 Drawing Sheets

HIGHLY SCALED ETSOI FLOATING BODY MEMORY AND MEMORY CIRCUIT

BACKGROUND

This invention involves the fabrication of computer memory. Specifically, the invention involves the fabrication of floating body memory with an extremely thin silicon on insulator layer.

An eDRAM memory cell typically relies on a transistor to read and write a charge to a capacitor. In this way, information may be stored and accessed. As semiconducting devices have become smaller, memory cells have been developed that do not require a conventional capacitor. One of these memory devices is called zero capacitor RAM or Z-RAM. Another name used to refer to Z-RAM is floating body memory. Conventional floating body memory relies on a neutral region in a silicon on insulator body to store charge. In the neutral region, acceptor and donor concentrations are the same. For a floating body silicon on insulator device to function properly, a minimum amount of charge must be stored in order to register as a one or zero when a voltage shift in the silicon on insulator region occurs.

BRIEF SUMMARY

An example embodiment of the present invention is a floating body memory cell. The floating body memory cell may include a bi-layer heterojunction having a first semiconductor coupled to a second semiconductor. The first semiconductor and the second semiconductor may have different energy band gaps and energy band-offsets. The floating body memory cell may include a buried insulator layer. The floating body memory cell may also include a back transistor gate separated from the second semiconductor of the bi-layer heterojunction by at least the buried insulated layer. The floating body memory cell may include a front transistor gate coupled to the first semiconductor of the bi-layer heterojunction.

Another example embodiment of the present invention is a method for forming a floating body memory cell. The method may include forming a bi-layer heterojunction above a buried insulator layer. The buried insulator layer may be above a back transistor gate. The bi-layer heterojunction may include a first semiconductor coupled to a second semiconductor. The first semiconductor and the second semiconductor may have different energy band gaps and energy band-offsets. The method may also include forming a front transistor gate above the bi-layer heterojunction.

Yet another example embodiment of the invention is a floating body memory circuit. The floating body memory circuit may include a plurality of memory cells. The plurality memory cells may each include a bi-layer heterojunction having a first semiconductor coupled to a second semiconductor. The first semiconductor and the second semiconductor may have different energy band gaps and energy band-offsets. The plurality of memory cells may each also include a first buried insulator layer. The plurality of memory cells may each include a back transistor gate separated from the second semiconductor of the bi-layer heterojunction by at least the first buried insulated layer. The plurality of memory cells may each include a front transistor gate coupled to the first semiconductor of the bi-layer heterojunction.

The floating body memory circuit may include one or more logic devices integrated with the plurality of memory cells. The one or more logic devices each may include a substrate. The one or more logic device may each include a second buried insulator layer above the substrate. The one or more logic devices may each include a semiconductor on insulator (SOI) layer above the second buried insulator layer. The SOI layer may include one of silicon and silicon germanium.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-3.

As discussed in detail below, embodiments of the present invention include a floating body memory cell, method for fabricating a floating body memory cell, and a floating body memory circuit with a bi-layer heterojunction.

Figure 1:
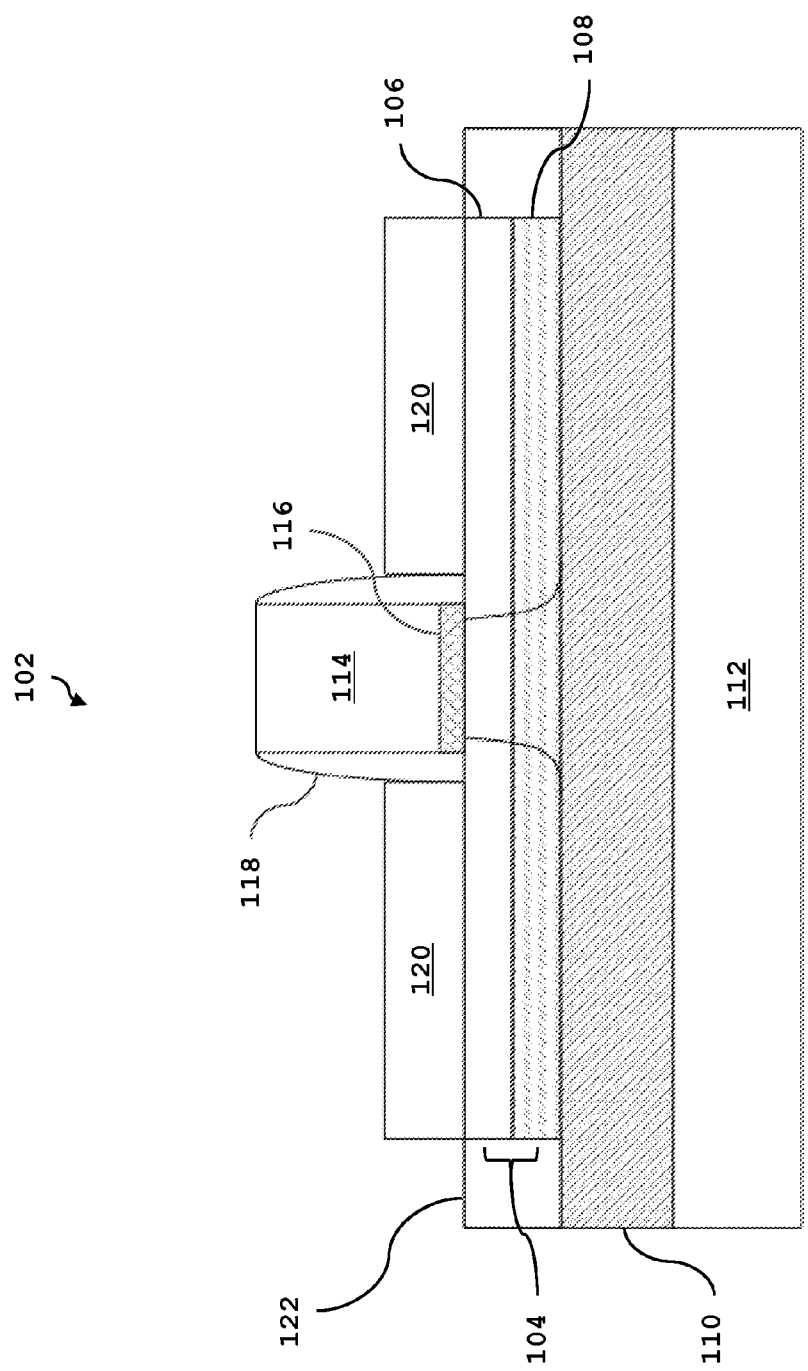
FIG. 1 shows an example embodiment of a floating body memory cell contemplated by the present invention.

FIG. 1 shows an example embodiment of a floating body memory cell 102. The floating body memory cell 102 may include a bi-layer heterojunction 104 having a first semiconductor 106 coupled to a second semiconductor 108. The first semiconductor 106 and the second semiconductor 108 may have different energy band gaps and energy band offsets. In one embodiment, the first semiconductor 106 and the second semiconductor 108 have different band offset energies relative to the vacuum level. The vacuum level is understood by those of ordinary skill in the art to be the energy of a free electron at rest far outside the influence of the potential of a solid. In one embodiment, the bi-layer heterojunction has a thickness between 4 nm and 12 nm. In one embodiment, either the first semiconductor or the second semiconductor is silicon, and the other is silicon germanium. For example, in an N-FET configuration the first semiconductor may be silicon and the second semiconductor may be silicon germanium. Similarly, in a P-FET configuration, the first semiconductor may be silicon germanium and the second semiconductor may be silicon. In another embodiment, the first semiconductor and/or the second semiconductor includes one of a combination of atoms from periodic table groups II and VI and a combination of atoms from periodic table groups III and V.

The floating body memory cell 102 may also include a buried insulator layer 110. In one embodiment, the buried insulator layer has a thickness between 10 nm and 50 nm. The floating body memory cell 102 may include a back transistor gate 112 separated from the second semiconductor 108 of the bi-layer heterojunction 104 by at least the buried insulated layer 110. In one embodiment, the back transistor gate 112 is a doped substrate. As recognized by one of ordinary skill in the art, the substrate may be doped n-type or p-type depending on the requirements and configuration of the system in which the memory cell is integrated.

The floating body memory cell 102 may include a front transistor gate 114 coupled to the first semiconductor 106 of the bi-layer heterojunction 104. The front transistor gate may also be coupled to a front transistor dielectric 116 and at least one front transistor sidewall 118. The floating body memory cell 102 may further include a raised source drain 120 coupled to the bi-layer heterojunction 104. The floating body memory cell 102 may also include a shallow trench isolation dielectric layer 122 proximate the raised source drain 116. Those of ordinary skill in the art will recognize that other elements of the floating body memory cell 102 may be understood as present though not shown. A contact, for example, may be coupled to the back transistor gate 112.

Figure 2:
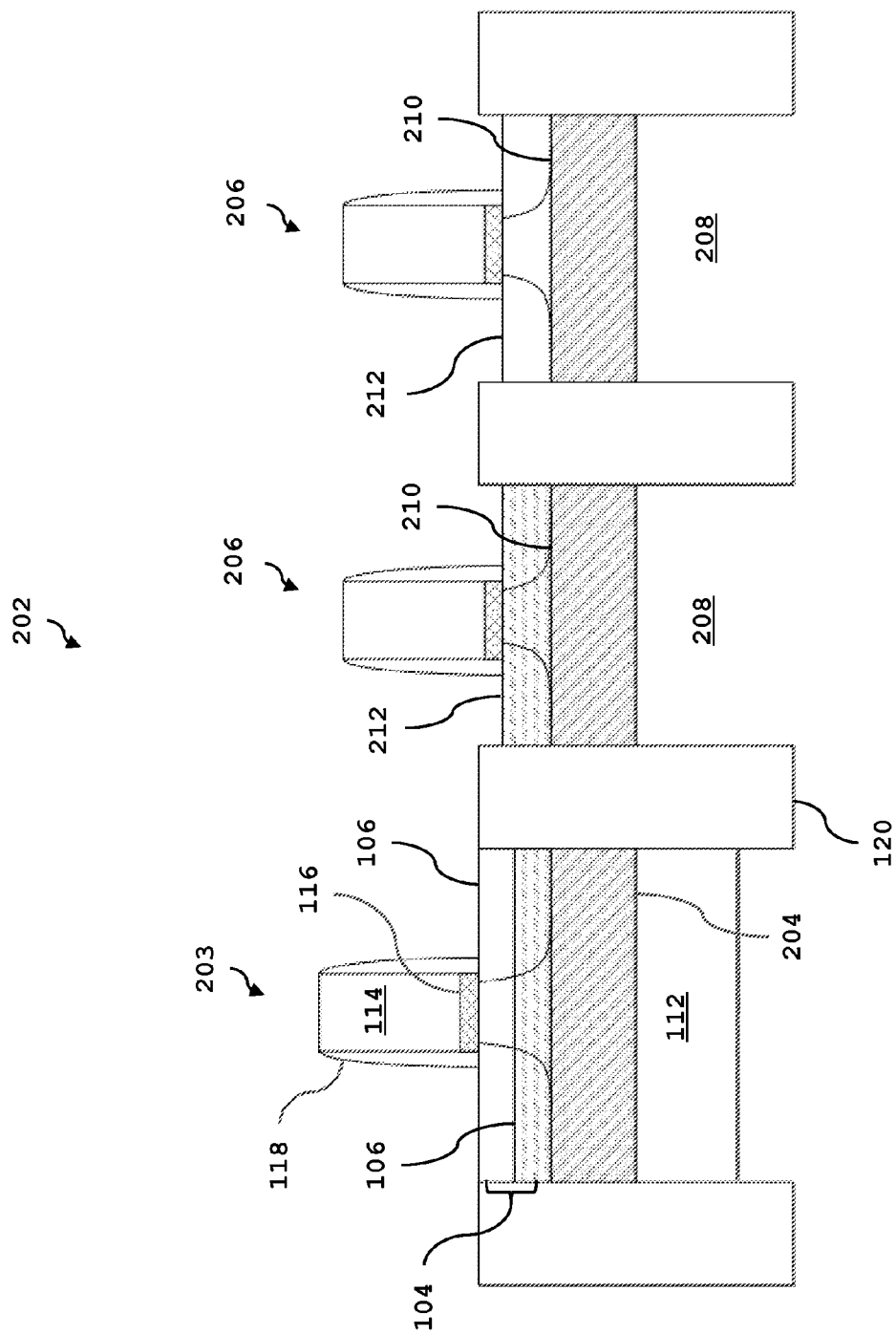
FIG. 2 shows an example embodiment of a floating body memory circuit along with logic devices contemplated by the present invention.

FIG. 2 shows an example embodiment of a floating body memory circuit 202. The floating body memory circuit 202 may include a plurality of memory cells 203. Each of the plurality of memory cells 203 may include a bi-layer heterojunction 104 having a first semiconductor 106 coupled to a second semiconductor 108. In one embodiment, the bi-layer heterojunction 104 has a thickness between 4 nm and 12 nm. The first semiconductor 106 and the second semiconductor 108 may have different energy band gaps and energy band offsets. In one embodiment, the first semiconductor 106 and the second semiconductor 108 have different band offset energies relative to the vacuum level. The vacuum level is described above. In each of the plurality of memory cells 203, at least one of the first semiconductor and the second semiconductor may include one of a combination of atoms from periodic table groups II and VI and a combination of atoms from periodic table groups III and V.

Each of the memory cells 203 may include a first buried insulator layer 204. Each of the memory cells 203 may include a back transistor gate 112 separated from the second semiconductor 108 of the bi-layer heterojunction 104 by at least the first buried insulated layer 204. In one embodiment, the back transistor gate 112 is a doped substrate. As recognized by one of ordinary skill in the art, the doped substrate may be doped n-type or p-type depending on the requirements and configuration of the system in which the floating body memory circuit 202 is integrated. Each of the memory cells 203 may include a front transistor gate 114 coupled to the first semiconductor 106 of the bi-layer heterojunction 104. The front transistor gate 114 of each of the plurality of memory cells 102 may also be coupled to a front transistor dielectric 116 and at least one front transistor sidewall 118. Each of the plurality of memory cells 203 may also include a shallow trench isolation dielectric layer 120. Each of the plurality of memory cells 102 may include additional elements described above for memory cells 102.

The floating body memory circuit 202 may also include one or more logic devices 206 integrated with the plurality of memory cells 203. Those of ordinary skill in the art will recognize that the shallow trench isolation layer 118 may be of an appropriate thickness in order to isolate the memory cells 102 from each other or from the logic devices 260. Each of the logic devices 206 may include a substrate 208. Each of the logic devices 206 may also include a second buried insulator layer 210 above the substrate 208. Each of the logic devices 206 may include a semiconductor on insulator (SOI) layer 212 above the second buried insulator layer 210. The SOI layer 212 in each of the one or more logic devices 206 may include one of silicon and silicon germanium.

In one embodiment, the memory cells 203 are integrated with at least one logic device 206 having a SOI layer 212 of silicon. In one embodiment, the memory cells 203 are integrated with at least one logic device 206 having a SOI layer 212 of silicon germanium. In one embodiment, the memory cells 102 are integrated with at least one logic device 206 having an SOI layer 212 of silicon and at least one logic device 206 having an SOI layer 212 of silicon germanium. Those of ordinary skill in the art will recognize that memory cells 203 having a bi-layer heterojunction 104 made of other materials may be integrated with logic devices 206 having an SOI layer 212 made from at least one of the materials in the bi-layer heterojunction 104. Those of ordinary skill in the art will recognize that other elements of the memory cell may be understood as present though not shown. A contact, for example, may be coupled to the back transistor gate.

Figure 3:
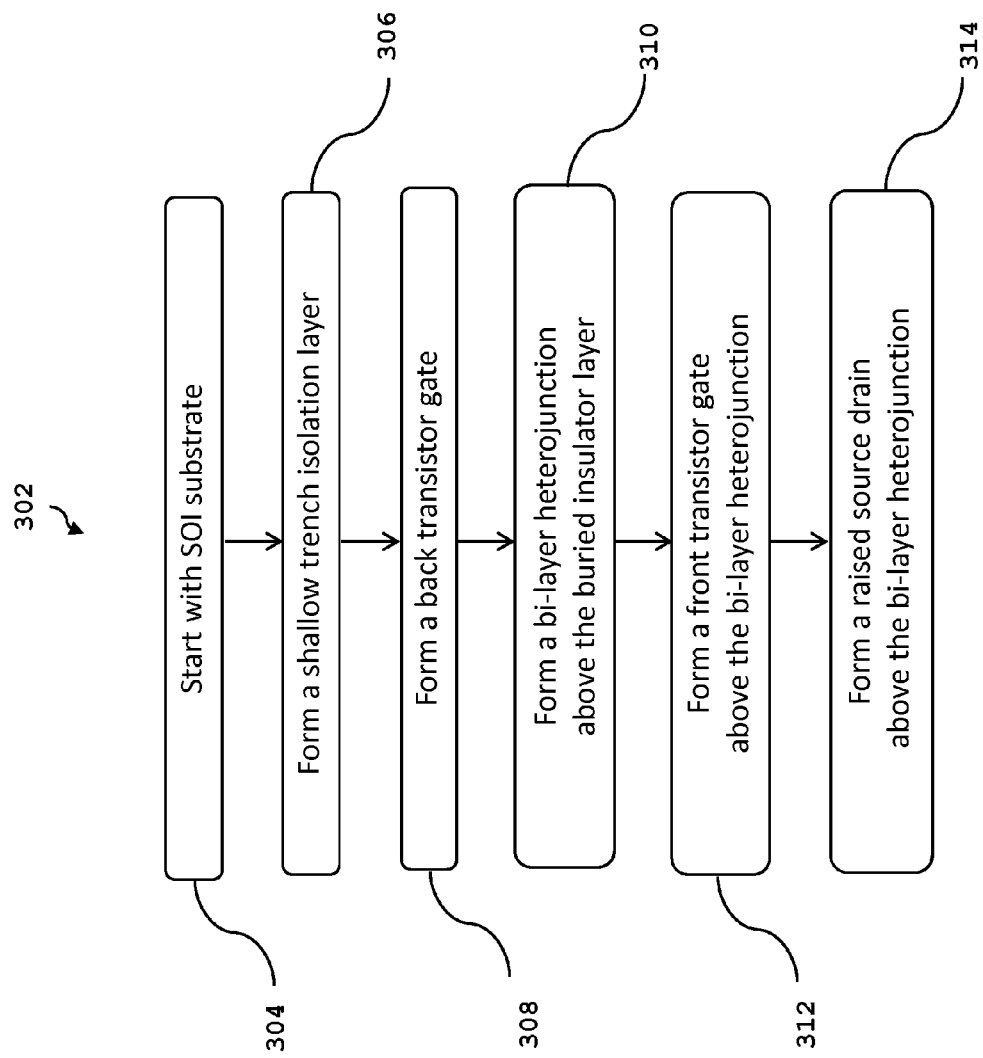
FIG. 3 shows a method for forming a floating body memory cell in accordance with the present invention.

FIG. 3 shows a method 302 for forming a floating body memory cell in accordance with the present invention. In one embodiment, method 302 may include a starting step 304 of starting with a semiconductor on insulator (SOI) substrate. In an alternate embodiment, the starting step 304 includes forming a back transistor gate as described below. In an alternate embodiment, the starting step may also include forming a buried insulator layer above the back transistor gate. In one embodiment, the buried insulator layer is formed with a thickness between 10 nm and 50 nm.

Method 302 may include a shallow trench isolation forming step 306 of forming a shallow trench isolation layer. In one embodiment, the shallow trench isolation layer is formed such that it may be proximate a raised source drain described below. In one embodiment, method 302 includes a back gate forming step 308 of forming a back transistor gate. In one embodiment, forming the back transistor gate is performed by doping a substrate. As recognized by one of ordinary skill in the art, the substrate may be doped n-type or p-type depending on the requirements and configuration of the system in which the memory cell is integrated. The substrate may be doped, for example, in a manner suitable for application of a voltage to create a voltage bias capable of generating charge carriers in at least one of the first semiconductor and second semiconductor.

Method 302 may include a bi-layer heterojunction forming step 310 of forming a bi-layer heterojunction above the buried insulator layer. In one embodiment, the bi-layer heterojunction is formed above a buried insulator layer, which is above a back transistor gate. The buried insulator layer and back transistor gate may be pre-fabricated or formed from a pre-fabricated substrate. In another embodiment, formation of the back transistor gate and/or buried insulator is part of the process flow. The bi-layer heterojunction may be formed by epitaxial growth or other techniques known by those of ordinary skill in the art. If formed from a pre-fabricated silicon on insulator or silicon germanium on insulator substrate, for example, oxidation and etching may be performed before epitaxial growth of either silicon or silicon germanium. In one embodiment, the bi-layer heterojunction is formed with a thickness between 4 nm and 12 nm. The bi-layer heterojunction may include a first semiconductor coupled to a second semiconductor. The first semiconductor and the second semiconductor may have different energy band gaps.

In one embodiment, the first semiconductor and the second semiconductor have different band offset energies relative to the vacuum level. The vacuum level is described above. In one embodiment, either the first semiconductor or the second semiconductor is silicon and the other is silicon germanium. The first semiconductor and second semiconductor may be chosen such that an energy barrier is formed at the interface of the bi-layer heterojunction, creating a quantum well to trap charge carriers in one of the first semiconductor and second semiconductor. In another embodiment, at least one of the first semiconductor and the second semiconductor includes one of a combination of atoms from periodic table groups II and VI and a combination of atoms from periodic table groups III and V.

Method 302 may include a front gate forming step 312 of forming a front transistor gate above the bi-layer heterojunction. In one embodiment, method 302 also includes a raised source drain forming step 314 of forming a raised source drain above the bi-layer heterojunction. The raised source drain may be formed by epitaxial growth or other techniques known by those of ordinary skill in the art.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A floating body memory cell, comprising:
   a bi-layer heterojunction having a first semiconductor coupled to a second semiconductor, the first semiconductor and the second semiconductor having different energy band gaps;
   a buried insulator layer;
   a back transistor gate separated from the second semiconductor of the bi-layer heterojunction by at least the buried insulated layer;
   a first raised source drain including a first bottom surface positioned above the bi-layer heterojunction, the first raised source drain including a first raised source drain height;
   a second raised source drain including a second bottom surface positioned above the bi-layer heterojunction, the second raised source drain including a second raised source drain height; and
   a front transistor gate including a third bottom surface positioned above the bi-layer heterojunction and between the first raised source drain and the second raised source drain, a height of the front transistor gate being greater than the first raised source drain height and the second raised source drain height; and
   wherein the bi-layer heterojunction extends along the first raised source drain the front transistor gate and the second raised source drain, and is in contact with the first, second and third bottom surfaces over their entire length, and
   wherein a first source/drain region of the floating body memory cell extends from a top surface of the first raised source drain through each of the first and second semiconductors of the bi-layer heterojunction, and wherein a second source/drain region of the floating body memory cell extends from a top surface of the second raised source drain through each of the first and second semiconductors of the bi-layer heterojunction.

2. The floating body memory cell of claim 1, wherein the first semiconductor and the second semiconductor have different band offset energies relative to the vacuum level.

3. The floating body memory cell of claim 1, wherein the back transistor gate is a doped substrate.

4. The floating body memory cell of claim 1, wherein the bi-layer heterojunction has a thickness between 4 nm and 12 nm.

5. The floating body memory cell of claim 1, wherein one of the first semiconductor and the second semiconductor is silicon and the other of the first semiconductor and the second semiconductor is silicon germanium.

6. The floating body memory cell of claim 1, wherein at least one of the first semiconductor and the second semiconductor includes one of a combination of atoms from periodic table groups II and VI and a combination of atoms from periodic table groups III and V.

7. The floating body memory cell of claim 1, wherein the buried insulator layer has a thickness between 10 nm and 50 nm.

8. The floating body memory cell of claim 1, further comprising:
   a shallow trench isolation dielectric layer proximate the raised source drain.

9. A method for forming a floating body memory cell, comprising:
   forming a bi-layer heterojunction above a buried insulator layer, the buried insulator layer being above a back transistor gate and the bi-layer heterojunction having a first semiconductor coupled to a second semiconductor, the first semiconductor and the second semiconductor having different energy band gaps;
   forming a first raised source drain including a first bottom surface positioned above the bi-layer heterojunction, the first raised source drain including a first raised source drain height;
   forming a second raised source drain including a second bottom surface positioned above the bi-layer heterojunction, the second raised source drain including a second raised source drain height; and
   forming a front transistor gate including a third bottom surface positioned above the bi-layer heterojunction and between the first raised source drain and the second raised source drain, a height of the front transistor gate being greater than the first raised source drain height and the second raised source drain height; and
   wherein the bi-layer heterojunction extends along the first raised source drain, the front transistor gate and the second raised source drain, and is in contact with the first, second and third bottom surfaces over their entire length, and
   wherein a first source/drain region of the floating body memory cell extends from a top surface of the first raised source drain through each of the first and second semiconductors of the bi-layer heterojunction, and wherein a second source/drain region of the floating body memory cell extends from a top surface of the second raised source drain through each of the first and second semiconductors of the bi-layer heterojunction.

10. The method of claim 9, wherein the first semiconductor and the second semiconductor have different band offset energies relative to the vacuum level.

11. The method of claim 9, wherein forming the back transistor gate is performed by doping a substrate.

12. The method of claim 9, wherein the bi-layer heterojunction is formed with a thickness between 4 nm and 12 nm.

13. The method of claim 9, wherein one of the first semiconductor and the second semiconductor is silicon and the other of the first semiconductor and the second semiconductor is silicon germanium.

14. The method of claim 9, wherein at least one of the first semiconductor and the second semiconductor includes one of a combination of atoms from periodic table groups II and VI and a combination of atoms from periodic table groups III and V.

15. The method of claim 9, wherein the buried insulator layer is formed with a thickness between 10nm and 50 nm.

16. The method of claim 9, further comprising:
   forming a shallow trench isolation layer proximate the raised source drain.

17. A floating body memory integrated circuit, comprising:
   a plurality of memory cells, the memory cells each comprising:

a bi-layer heterojunction having a first semiconductor coupled to a second semiconductor, the first semiconductor and the second semiconductor having different energy band gaps;

a first buried insulator layer;

a back transistor gate separated from the second semiconductor of the bi-layer heterojunction by at least the first buried insulated layer;

a first raised source drain including a first bottom surface positioned above the bi-layer heterojunction, the first raised source drain including a first raised source drain height;

a second raised source drain including a second bottom surface positioned above the bi-layer heterojunction, the second raised source drain including a second raised source drain height; and a front transistor gate including a third bottom surface positioned above the bi-layer heterojunction and between the first raised source drain and the second raised source drain, the bi-layer heterojunction extending along the first raised source drain, the front transistor gate and the second raised source drain, and is in contact with the first, second and third bottom surfaces over their entire length, a height of the front transistor gate being greater than the first raised source drain height and the second raised source drain height;

wherein the bi-layer heterojunction extends along the first raised source drain, the front transistor gate and the second raised source drain, and is in contact with the first, second and third bottom surfaces over their entire length, and wherein a first source/drain region of the floating body memory cell extends from a top surface of the first raised source drain through each of the first and second semiconductors of the bi-layer heterojunction, and wherein a second source/drain region of the floating body memory cell extends from a top surface of the second raised source drain through each of the first and second semiconductors of the bi-layer heterojunction; and one or more logic devices integrated with the plurality of memory cells, the one or more logic devices each comprising:

a substrate;

a second buried insulator layer above the substrate; and a semiconductor on insulator (SOI) layer above the second buried insulator layer, the SOI layer including one of silicon and silicon germanium.

18. The floating body memory circuit of claim 17, wherein the first semiconductor and the second semiconductor have different band offset energies relative to the vacuum level.

19. The floating body memory circuit of claim 17, wherein the back transistor gate is a doped substrate.

20. The floating body memory circuit of claim 17, wherein the bi-layer heterojunction has a thickness between 4 nm and 12 nm.

* * * * *